United States Patent [19]
Repinski et al.

[11] Patent Number: 5,638,595
[45] Date of Patent: Jun. 17, 1997

[54] METHOD FOR FABRICATING OPEN MR MAGNET GRADIENT COIL

[75] Inventors: Gregory A. Repinski, Waukesha; Kevin E. Kinsey, New Berlin; Christopher C. Myers, Shorewood, all of Wis.

[73] Assignee: General Electric Company, Milwaukee, Wis.

[21] Appl. No.: 555,374

[22] Filed: Nov. 9, 1995

[51] Int. Cl.$^6$ .................................................. H01F 41/00
[52] U.S. Cl. ..................... 29/602.1; 29/418; 128/653.5; 324/318
[58] Field of Search ................................... 29/602.1, 418, 29/527.4; 335/299; 324/318; 128/653.5; 336/200

[56] References Cited

U.S. PATENT DOCUMENTS 3,624,896  12/1971  Daubeney et al. ............... 29/602.1 X
5,378,989  1/1995  Barber et al. ........................ 324/318

Primary Examiner—Carl E. Hall
Attorney, Agent, or Firm—James O. Skarsten; John H. Pilarski

[57] ABSTRACT

A method is provided for fabricating a gradient coil for an MR imaging system having an open magnet. The method includes forming a structure from thin conductive material such as copper, the structure generally comprising a section of a cylinder and a section of an annulus joined to an edge of the cylinder section as a flange. During a first cutting operation, a plurality of first groove segments are cut through the material, each of the first groove segments lying in one of a plurality of cutting zones selectively positioned around the structure, a strip of material positioned between two adjacent groove segments comprising a coil turn segment. The coil turn segments of a cutting zone are rigidly joined to one another and to a support frame comprising the outer edge of the structure by suitable means. Thereafter, a second cutting operation is performed, whereby a plurality of second groove segments are cut through the material to completely form the gradient coil.

20 Claims, 5 Drawing Sheets

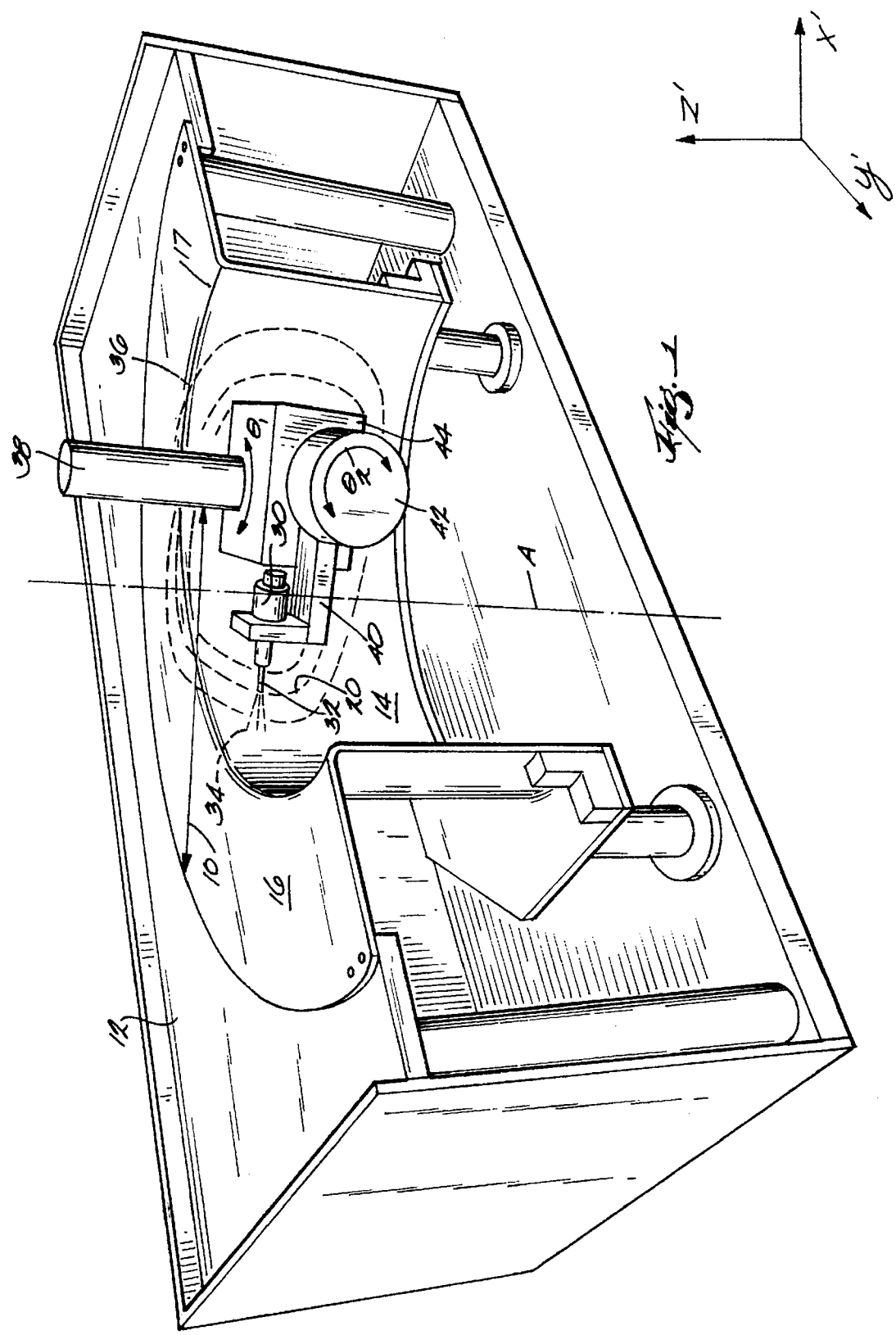

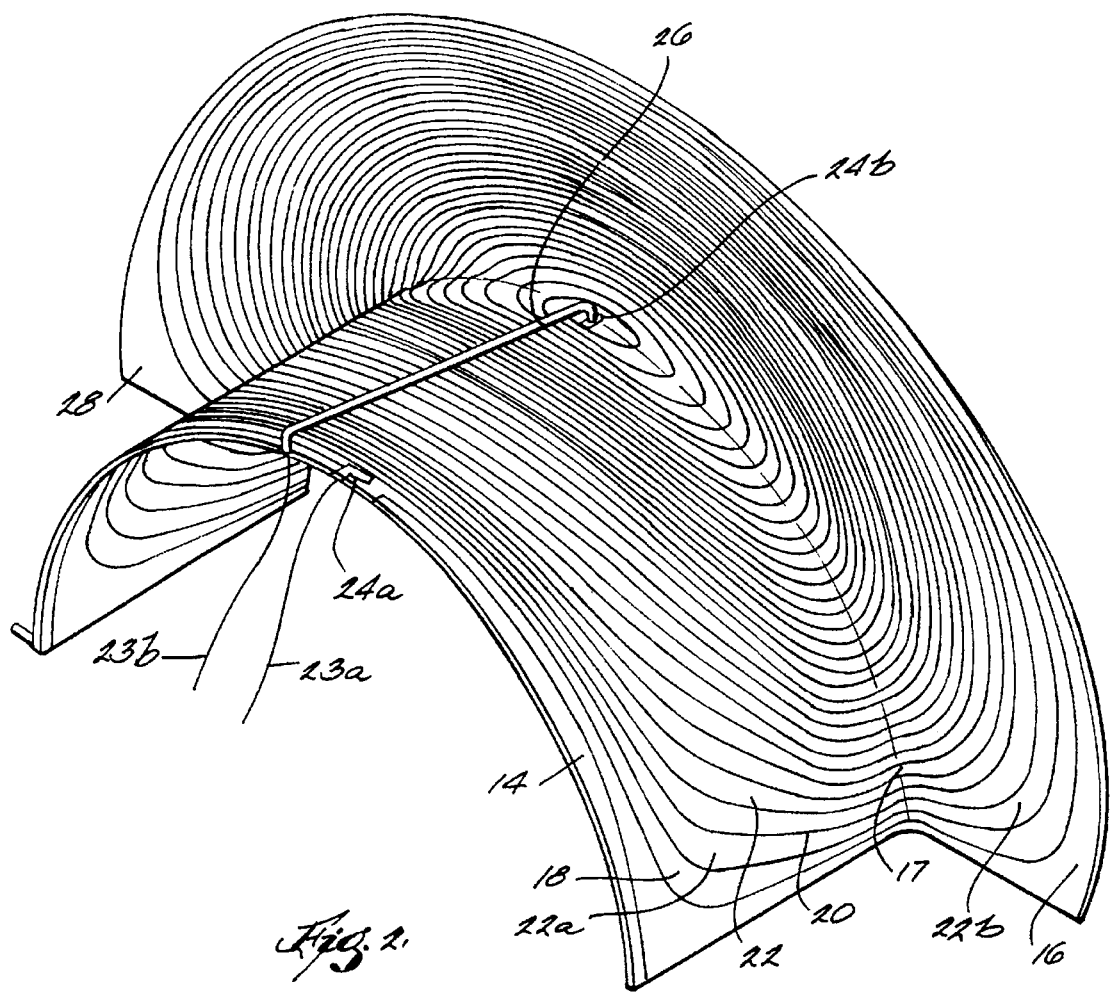

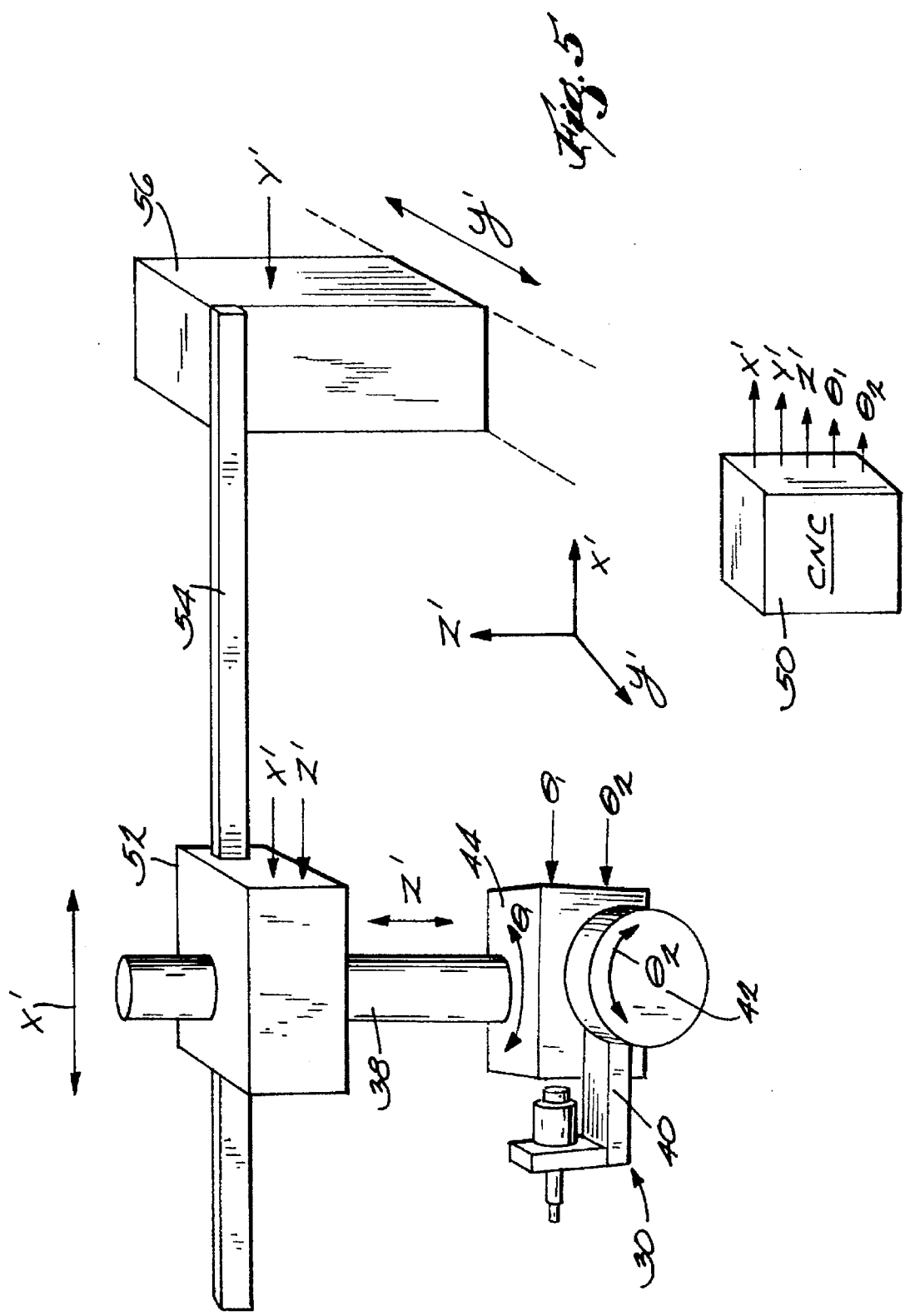

METHOD FOR FABRICATING OPEN MR MAGNET GRADIENT COIL

The invention disclosed and claimed herein pertains to a method for making or fabricating gradient coils for use in connection with a magnetic resonance (MR) imaging system having an open magnet. More particularly, the invention pertains to a method for manufacturing coils of such type with substantially increased efficiency.

In the past, the magnets used in MR imaging were generally cylindrical, and had a bore which was closed except for an opening at one end. A patient or other subject of MR imaging was partially or completely inserted into the magnet bore, and was thus largely inaccessible to attendant medical personnel during imaging. Also, patients frequently experienced discomfort, and in some cases claustrophobia, from being enclosed within a magnet bore. To overcome some of these problems, open MR magnets have now been developed, as exemplified by commonly assigned U.S. Pat. No. 4,924,198, issued May 8, 1990 to E. T. Laskaris. Such magnets generally comprise two coaxial spaced-apart super conducting rings, and enable medical personnel to observe, and even possibly to perform surgery on, patients during the MR imaging process. Such magnets also serve to alleviate patient discomforts associated with closed bore magnets.

As is well known, X-, Y-, and Z-gradient coils are essential components of an MR magnet. Gradient coils for the prior art closed bore MR magnet can be manufactured with a comparatively high degree of efficiency. In particular, the transverse X- and Y-gradient coils, characterized by intricate "fingerprint" patterns, can be fabricated by means of a photo etching process on a sheet of copper while the sheet is in a planar, or two-dimensional configuration. The etched sheet is then wrapped around a cylindrical gradient coil form, and supported thereby.

Notwithstanding the benefits of the open MR magnet, it has been found that gradient coils required therefor must have a geometry that is substantially more complex than the gradient coil geometry of the prior art closed bore magnet. A useful set of gradient coils is shown, for example, in commonly assigned U.S. Pat. No. 5,378,989, issued Jan. 2, 1995 to Barber et. al. FIG. 5a of such patent depicts a set of X- or Y- gradient coils, each formed on a structure comprising a cylinder with a flange joined to an end thereof. Each coil is formed so that the respective turns thereof lie partially on the flange component of the structure and partially on the cylindrical component thereof. Because of their complex geometry, it has proved to be difficult to fabricate gradient coils of the type shown in Barber et. al. with the comparatively high level of efficiency achieved in constructing prior art gradient coils, as described above. For example, one effort to manufacture a gradient coil of the type shown in Barber required the hand soldering of in excess of 400 conductor paths.

SUMMARY OF THE INVENTION

The present invention provides a method for fabricating a gradient coil for use in connection with an open magnet in an MR imaging system. The method includes the step of forming a structure to have a specified three-dimensional shape from one or more sheets of conductive material, such as copper, and placing the three-dimensional structure in a fixture. A cutting path is defined or described on the fixtured structure, the cutting path comprising the boundary of a spiraled strip of a portion of the structure material. The method further includes the step of cutting through the material along a portion of the cutting path to form a corresponding portion of the coil. The corresponding coil portion is then secured by some means in a substantially fixed relationship with the remainder of the structure, while the material is cut along the remainder of the path to form the remainder of the coil.

In a preferred embodiment, the structure comprises the section of a cylinder lying on one side of a hypothetical plane passing through the cylinder axis, and a corresponding section of an annular member which is joined to an edge of the cylinder as a flange. The coil comprises a number of coil turns, each defined by the cutting path, a portion of each turn lying on the cylinder section, and the remainder lying on the section of the annular member. Preferably, the structure material is cut along the cutting path by means of a computer numerically controlled cutting tool.

An object of the invention is to significantly increase efficiency in a method for manufacturing gradient coils for an open MR magnet.

Another object is to provide a method of the above type, wherein the coil is manufactured in accordance with a two stage process to prevent coil deformation.

Another object is to prevent gradient coil deformation, either during fabrication, or while coils are being handled after fabrication.

Another object is to provide a method of such type wherein the coil fabrication process is substantially automated, such as by enabling a computer numerically controlled machine to be used in forming intricate coil patterns.

Another object is to provide a method of the above type which enables the width of grooves which are cut in manufacturing gradient coils to be significantly reduced.

Another object is to provide a method of the above type which employs a water jet cutting tool to reduce the groove size and to provide a coil of increased reliability.

These and other objects of the invention will become more readily apparent from the ensuing specification, taken together with the accompanying drawings.

BRIEF DESCRIPTION OF THE DRAWINGS

FIG. 1 is a perspective view showing a gradient coil structure secured in a fixture.

FIG. 2 is a perspective view depicting the form or geometry of the complete gradient coil which is to be manufactured in accordance with an embodiment of the invention.

FIG. 5 is a simplified perspective view showing means for selectively moving a cutting tool with respect to the gradient coil structure shown in FIG. 1.

DETAILED DESCRIPTION OF THE PREFERRED EMBODIMENT

Figure 4:
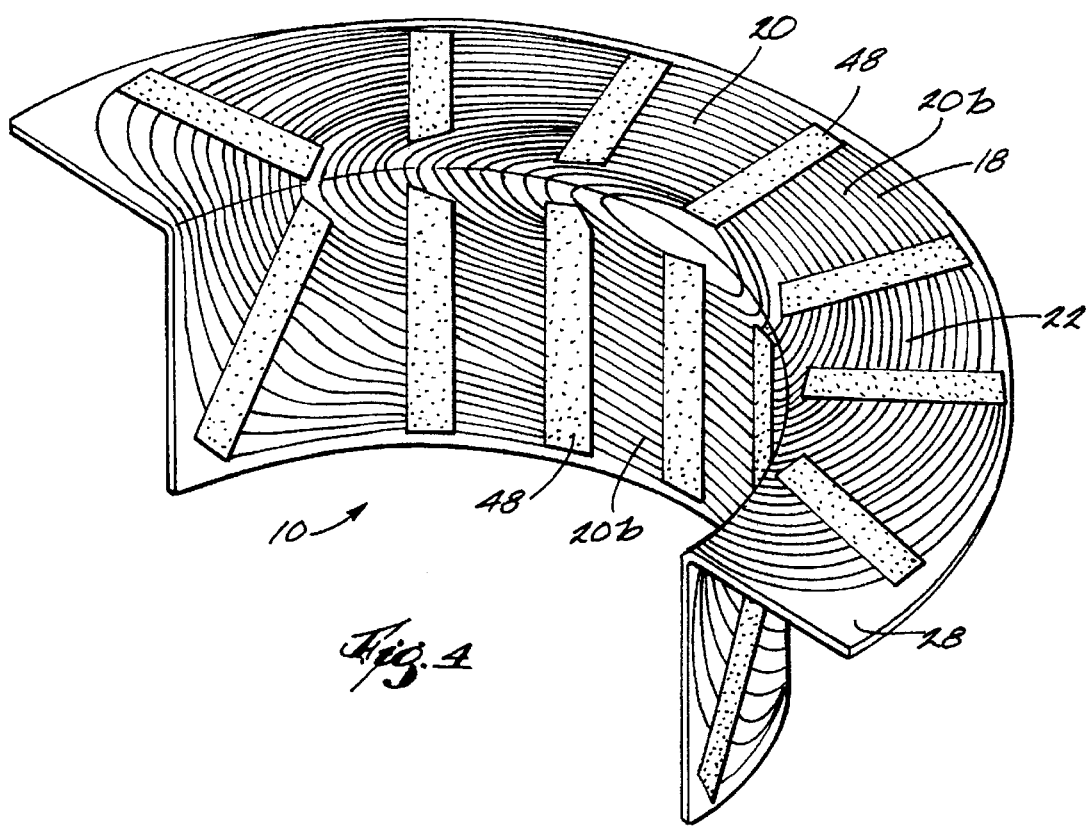
FIG. 4 is a perspective view illustrating a second stage in manufacturing the gradient coil shown in FIG. 2.

Referring to FIG. 1, there is shown a gradient coil structure 10 secured in a fixture 12. Structure 10 generally comprises a cylinder section 14, and a flange 16 fixably joined to an end thereof. More specifically, cylinder section 14 comprises half of a cylinder, i.e., the portion of a cylinder lying on one side of a hypothetical plane (not shown) which passes through the cylinder axis A. Flange 16 comprises the corresponding half of an annulus or annular member, joined to the end of the cylinder section 14, the annulus having inner and outer diameters. Thus, structure 10 generally has the form of one half of a "top hat" which is missing its top or upper end.

Structure 10 is usefully constructed of thin conductive material such as copper sheet having a thickness on the order of 0.125 inch. Cylinder section 14 and flange 16 can be independently formed, and then welded together along a common edge 17 thereof. Alternatively, a complete cylinder and annulus may be welded together to form an entire "top hat" structure, which is then cut in half to provide two gradient coil structures 10. As further alternatives, a cylinder of copper can be selectively spun or rotated at high speed about its axis, to flair one end thereof into a disc or annulus, or an annulus can be spun to flair its inside edge into a cylinder.

Referring now to FIG. 2, there is shown a completed gradient coil 18, which is formed in gradient coil structure 10 by cutting a spiraling groove 20 through the copper sheet of structure 10. Respective coil turns or runs 22, which collectively comprise gradient coil 18, are formed as the groove is cut. Each turn 22 comprises a thin, spiraling strip of the copper sheet which lies between two adjacent portions of the groove 20. Portion 22a of each coil turn comprises material of cylinder section 14, and a portion 22b of each coil turn comprises material of the flange 16. Gradient coil 18 is energized to generate a magnetic field by coupling an electric current thereto through a lead 23a, welded to a terminal 24a at one end of spiraling coil 18. The current is conducted away from coil 18 through a lead 23b, which is coupled to a copper bar 26 welded to a terminal 24b at the opposing end of coil 18.

Use of welding, rather than soldering, to attach terminals and the like to the copper coil material is considered to be an additional advantage. In conventional gradient coils of the type described above, laminated sheets of fiberglass are frequently required as a backing, to provide support. The high heat associated with a welding process would tend to cause the fiberglass backing to delaminate.

The portion of structure 10 not formed into gradient coil 18, i.e., the portion thereof which lies outside of the groove 20 and includes the outer edge around structure 10, comprises a supporting frame 28 for the coil 18.

Referring once more to FIG. 1, there is a shown a water jet cutting tool 30 of a type known in the art. Tool 30 is provided with a nozzle 32 which projects a thin stream of cutting fluid 34, such as water containing garnet chips or other abrasive particles, under very high pressure. The pressure level is sufficient to drive the cutting fluid through the copper sheet forming gradient coil structure 10. In order to cut through structure 10 at a given point, cutting tool 30 is positioned so that nozzle 32 is in closely-spaced relationship with the surface of structure 10 at the given point, and is always normal or perpendicular thereto. Thus, by selectively moving cutting tool 30 along a cutting path 36 coinciding with the spiraled path of groove 20, the groove 20 may be cut to form gradient coil 18. (In FIG. 1, only a portion of groove 20 is shown, as a solid line, and only a portion of cutting path 36 is shown, as a dashed line.) By using a water jet cutting tool 30, a groove 20 having a width as narrow as on the order of 0.04 inch may be formed through copper sheet having a thickness of 0.125 inch. By providing a groove 20 of such narrow width, coil resistance is significantly reduced, and the density of coil turns or runs, for a given coil area, may be significantly increased.

FIG. 1 shows cutting tool 30 suspended from an elongated support member 38, oriented in parallel relation with the z'-axis. Member 38 is controllably movable, by means described hereinafter in connection with FIG. 5, to translate cutting tool 30, with respect to fixtured structure 10, along each of three mutually orthogonal x'-, y'- and z'- axes, the z'-axis being parallel to the axis A. In a simplified arrangement, cutting tool 30 is mounted in a frame 40, and joined thereby to a drum 42. The drum 42 is mounted for rotation relative to a housing 44, attached to the end of member 38. An actuating mechanism (not shown) in housing 44 controllably rotates drum 42, and thereby cutting tool 30, between an orientation wherein nozzle 32 is directed horizontally, and an orientation wherein nozzle 32 is directed downwardly, as viewed in FIG. 1. Means (not shown) in housing 44, such as bearings or the like, support housing 44 for rotation at the end of member 38, and a second actuating mechanism (not shown) in housing 44 controllably rotates housing 44, and thereby cutting tool 30 about member 38. Thus, tool 30 may be maneuvered as required, to cut portions of groove 20 in both cylinder section 14 and flange 16. Hereinafter, rotation of tool 30 about elongated member 38, i.e., about the z'-axis or an axis parallel thereto, is referred to as $\theta_1$ rotation. Rotation of tool 30 with drum 42, i.e., around an axis which is parallel to or lies in the x'-y' plane, is referred to as $\theta_2$ rotation.

In accordance with the invention, and as described hereinafter in connection with FIGS. 3 and 4, cutting tool 30 is moved in a prescribed pattern, relative to the fixtured structure 10, such that the process of cutting groove 20 to form the gradient coil 18 is performed in at least two stages. Such process is intended to prevent or substantially reduce coil deformation, so that the coil turns 22 will maintain their respective positional relationships with one another and with coil supporting frame 28, as defined by the geometry of structure 10 prior to the cutting of groove 20. Through the invention, such geometric integrity of the coil 18, necessary for proper coil operation, will be maintained even after the coil has been removed from fixture 12, and notwithstanding the narrow width of some of the coil turns, which may be on the order of 0.200 inches.

Figure 3:
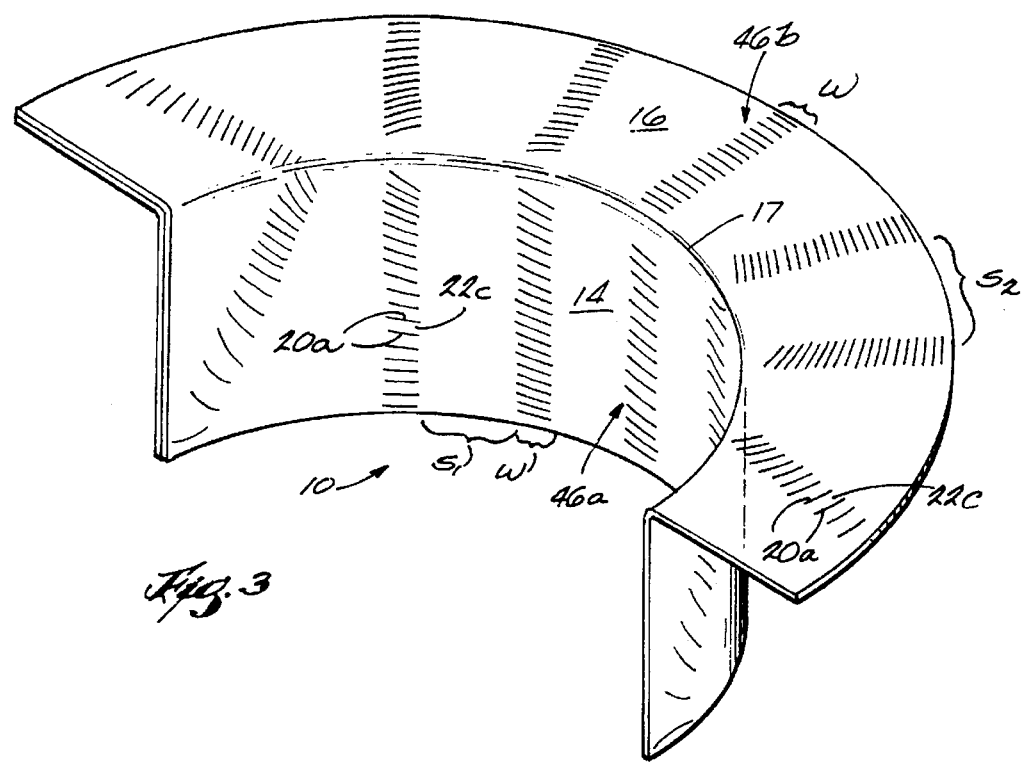
FIG. 3 is a perspective view illustrating a first stage in manufacturing the gradient coil.

Referring to FIG. 3, there are shown a number of cutting zones 46a and 46b, each having a width w. The zones 46a are positioned around cylinder section 14 of structure 10, in spaced-apart relationship from one another, and respectively extend from a position proximate to the lower edge of cylinder section 14, as viewed in FIG. 3, to a position proximate to edge 17 between section 14 and flange 16. The zones 46b are positioned around flange 16, likewise in spaced-apart relationship, and respectively extend from a position proximate to the outer edge of flange 16 to a position proximate to edge 17. Cutting zones 46a on cylinder section 14 are spaced apart a distance $s_1$, and cutting zones 46b on flange 16 are spaced apart a distance $s_2$ at the outer edge of the flange. In a variation shown in FIG. 3, the zones 46a proximate to the side edges of cylinder section 14 are oriented at an angle, relative to cylinder section axis A.

During the first stage of a cutting operation, cutting tool 30 (not shown in FIG. 3) is operated to cut all portions of groove 20 which intersect or are included in each of the cutting zones 46a and 46b. Thus, each cutting zone 46a and 46b includes a number of groove segments 20a, where each groove segment 20a comprises a small, substantially linear portion of groove 20, and has a length on the order of the cutting zone width w. In a useful embodiment, w is selected to be 1.5 inches, and separation distances $s_1$ and $s_2$ are both on the order of 4 inches. It will be noted that adjacent groove segments 20a included in a cutting zone 46a or 46b form a coil turn segment 22c, such segment 22c being the portion of the coil turn 22 which intersects the coil zone 46a or 46b, and is positioned between the two adjacent groove segments 20a.

Referring to FIG. 4, there is shown a layer of epoxy 48 applied to gradient coil structure 10, across each of the cutting zones 46a and 46b. After respective applied layers of epoxy 48 have cured or solidified, the coil turn segments 22c of each cutting zone become rigidly joined together, and to the coil support frame 28. The cutting tool 30 (not shown in FIG. 4) is then operated during a second stage cutting operation to cut all remaining portions of groove 20, i.e., all portions thereof not intersecting a cutting zone 46a or 46b, to form gradient coil 18 in its entirety. Such portions comprise a set of groove segments 20b. Thereafter, the cured layers of epoxy 48 serve to fixably hold the respective coil turns 22 of gradient coil 18 in the same geometric relationship relative to one another, and to support frame 28, which they have prior to the cutting of groove 20. Such geometric relationship is retained even after gradient coil structure 10 is removed from fixture 12 for installation with respect to an open MR magnet.

While FIG. 3 and 4 do not show fixture 12 for purposes of simplifying illustration, it is to be understood that coil structure 10 is retained therein until gradient coil 18 has been formed completely, as described above.

Referring to FIG. 5, there is shown a computer numerical control (CNC) 50, of a type well known in the art. CNC 50 is provided with instructions to generate control signals X', Y', Z' and $\theta_1$ and $\theta_2$ to move cutting tool 30 to form groove 20 in structure 10 (not shown in FIG. 5), in accordance with the two stage process described above. Thus, CNC 50 initially generates a first set of control signals X', Y', Z', $\theta_1$ and $\theta_2$ to direct cutting tool 30 to sequentially cut the groove segments 20a. Thereafter, CNC 50 generates a second set of control signals, to direct cutting tool 30 to cut the groove segments 20b.

FIG. 5 further shows elongated member 38, supporting cutting tool 30 and housing 44, movably mounted in a mechanism 52. Mechanism 52, which is mounted for movement along a rail 54 or the like oriented in parallel relation with the x'-axis, comprises a device which receives the control signals X' and Z' from CNC 50. In response to a control signal Z', mechanism 52 is actuated to move member 38, and therefore tool 30, along the z'-axis by a corresponding amount. In response to a control signal x', mechanism 52 is actuated to move along the rail 54 by a corresponding amount. Thus, mechanism 52 provides both the x'-axis and z'-axis travel required to maneuver cutting tool 30 in forming the groove 20.

Referring further to FIG. 5, there is shown rail 54 mounted on a column 56, constrained to move along the y'-axis. An actuating mechanism (not shown) in column 56 receives Y' control signals from CNC 50, and in response thereto moves the column 56 along the y'-axis by a corresponding amount. The y'-axis travel for cutting tool 30 is provided thereby. FIG. 5 also shows the $\theta_1$ and $\theta_2$ control signals coupled to the actuating mechanism in housing 44, referred to above, to control rotation of cutting tool 30.

FIG. 5 is intended to show one example of a simplified mechanical arrangement for moving cutting tool 30. Numerous designs and configurations therefor are readily available in the arts, such as the machining center arts. It is commonplace therein to provide mechanical structure and associated actuating devices for rotating a cutting tool and translating the tool along three orthogonal axes with respect to the workpiece, with a very high level of precision and under CNC control. It is to be noted that in some arrangements, the fixture 12 could be movable along one or more orthogonal axes to provide the required positioning of structure 10 with respect to cutting tool 30.

Figure 6:
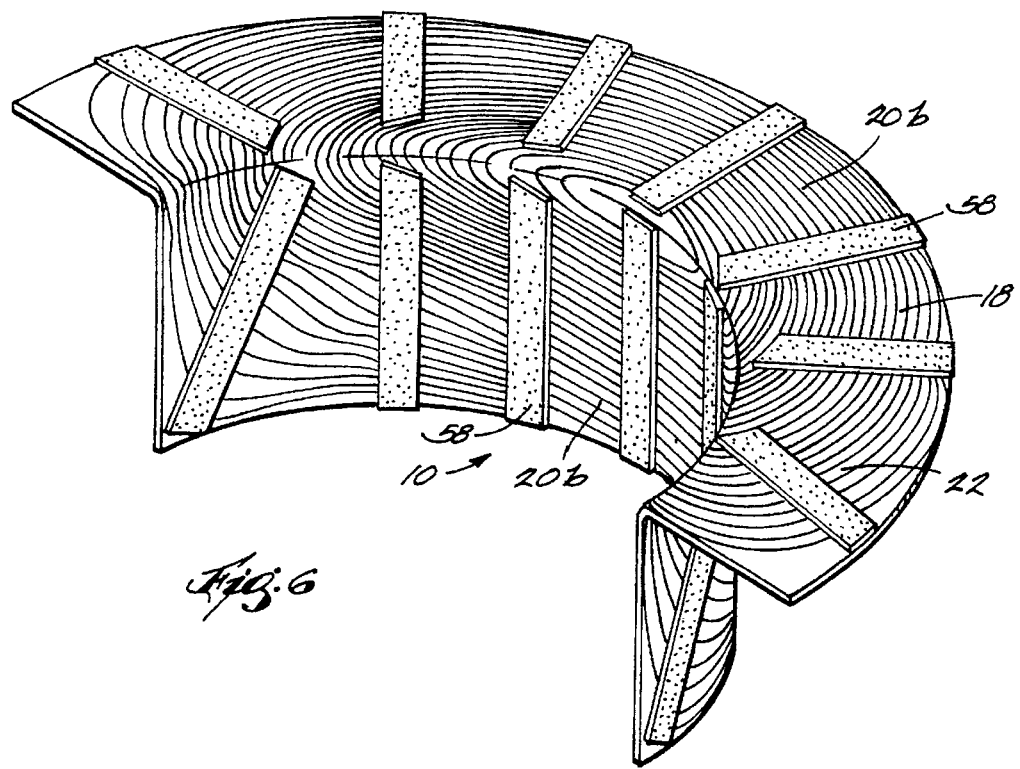
FIG. 6 is a perspective view illustrating a modification of the invention.

Referring to FIG. 6, there is shown a modification of the invention, wherein coil holding strips 58 are substituted for the layers of epoxy 48 described above in connection with FIG. 4. After respective segments 20a have been cut in the gradient coil structure 10, as described above, holding strips 58 are attached thereto, to overlay each of the cutting zones 46a and 46b. Strips 58 are joined to both the concave and convex sides of cylinder section 14, and to both the upper and lower sides of flange 16, as viewed in FIG. 6. Each holding strip 58 usefully comprises a strip of fiberglass, and is secured to gradient coil structure 10 by means of epoxy or other suitable adhesive.

Obviously, many other modifications and variations of the present invention are possible in light of the above teachings. It is therefore to be understood that within the scope of the enclosed concept, the invention may be practiced otherwise than as specifically described.

What is claimed is:

1. A method for fabricating a gradient coil for an MR imaging system having an open magnet, said method comprising the steps of:

forming a structure having a specified three-dimensional shape from thin conductive material;

defining the boundary on said three-dimensional structure of a specified spiraled strip of said material;

cutting through said three-dimensional structure along a portion of said boundary to form a corresponding portion of said coil;

providing means to substantially hold said corresponding coil portion in a fixed geometric relationship with the remainder of said structure; and cutting through said three-dimensional structure along the remainder of said path to form the remainder of said coil.

2. The method of claim 1 wherein:

said method includes placing said structure in a fixture prior to said cutting steps, and removing said structure from said fixture after said cutting steps for use in connection with said open magnet; and said holding means comprises a means for holding the entire coil in substantially fixed geometric relationship with the remainder of the structure after removal from the fixture.

3. The method of claim 1 wherein:

said step of providing holding means comprises applying a layer of specified adhesive material to said corresponding coil portion.

4. The method of claim 3 wherein:

said specified adhesive material comprises epoxy.

5. The method of claim 1 wherein:

said step of providing holding means comprises attaching strips of specified material to said corresponding coil portion.

6. The method of claim 1 wherein:

said material comprises copper.

7. The method of claim 1 wherein said structure comprises:

a first component substantially comprising a section of a cylinder oriented along the cylinder axis; and a second component comprising a section of an annulus joined proximate to an edge of said cylinder section.

8. The method of claim 7 wherein:

said coil comprises a plurality of coil turns, a first portion of each of said coil turns lying on said cylinder section, and a second portion of each of said coil turns lying on said annulus section.

9. The method of claim 7 wherein:

said forming step comprises forming said first and second components from sheets of said conductive material, and then selectively joining said components together.

10. The method of claim 7 wherein said forming step comprises:

forming a cylinder of said material, and then flaring an end of said cylinder into a flange; and cutting away a portion of said flared cylinder to form said structure, said structure comprising the portion of said flared cylinder lying on one side of a hypothetical plane passing through said flared cylinder and including the axis thereof.

11. The method of claim 7 wherein said forming step comprises:

forming an annular disc from said conductive material;

flaring said disc to form a cylinder along the inner edge of said disc; and cutting away a portion of said flared disc to form said structure, said structure comprising a portion of said flared disc lying on one side of a hypothetical plane passing through said flared disc and including the axis of the cylinder portion thereof.

12. The method of claim 7 wherein:

said cutting steps are performed by means of a cutting tool operated under computer numerical control, said cutting tool mounted for selected rotational and translational movements.

13. A method for fabricating a gradient coil for an MR imaging system having an open magnet, said method comprising the steps of:

forming a structure having a specified three-dimensional shape from thin conductive material;

cutting a plurality of first groove segments through said structure, each of said first groove segments included in one of a plurality of cutting zones selectively positioned around said structure, a strip of said material positioned between two adjacent first groove segments comprising a coil turn segment;

rigidly joining the coil turn segments of a cutting zone to one another and to a support frame comprising an outer edge of said structure; and after said joining step cutting a plurality of second groove segments through said structure to form said gradient coil.

14. The method of claim 13 wherein said structure comprises:

a first component substantially comprising a section of a cylinder oriented along the cylinder axis; and a second component comprising a section of an annulus joined to an edge of said cylinder section.

15. The method of claim 14 wherein:

said coil comprises a plurality of coil turns, a first portion of each of said coil turns comprising material of said cylinder section, and a second portion of each of said coil turns comprising material of said annulus section.

16. The method of claim 15 wherein:

said cutting steps are performed by means of a cutting tool operated under computer numerical control, said cutting tool mounted for selected rotational and translational movements.

17. The method of claim 16 wherein:

said cutting tool comprises a water jet cutting tool.

18. The method of claim 13 wherein said joining step comprises:

applying a layer of specified adhesive material to said structure across each of said cutting zones to join the coil turn segments of a cutting zone to one another and to said support frame.

19. The method of claim 18 wherein:

said adhesive material comprises epoxy.

20. The method of claim 13 wherein said joining step comprises:

attaching strips of selected material to said structure across said cutting zones to join respective coil turn segments of a cutting zone to one another and to said support frame.

* * * * *